United States Patent
Conway et al.

(10) Patent No.: US 6,867,401 B2
(45) Date of Patent: Mar. 15, 2005

(54) WAVEGUIDE FOREIGN OBJECT DAMAGE PREVENTION WINDOW

(75) Inventors: William Conway, Ipswich, MA (US); Vincent Marini, Ipswich, MA (US); Robert McGowan, Newbury, MA (US); Carlos Dantas, Billerica, MA (US); Timothy Smith, Georgetown, MA (US)

(73) Assignee: Communications & Power Industries, Inc., Beverly, MA (US)

( * ) Notice: Subject to any disclaimer, the term of this patent is extended or adjusted under 35 U.S.C. 154(b) by 150 days.

(21) Appl. No.: 10/222,255

(22) Filed: Aug. 16, 2002

(65) Prior Publication Data

US 2003/0034345 A1 Feb. 20, 2003

Related U.S. Application Data

(60) Provisional application No. 60/312,857, filed on Aug. 16, 2001.

(51) Int. Cl.[7] .................................................. H05B 6/70
(52) U.S. Cl. ...................... 219/690; 219/756; 333/248; 137/252
(58) Field of Search ................................. 219/746, 756, 219/690, 695; 137/252; 333/252, 248–249, 250, 251, 257, 253, 254, 255, 256, 258, 259, 260; 55/385.6, 478

(56) References Cited

U.S. PATENT DOCUMENTS

| | | | | |
|---|---|---|---|---|
| 3,651,622 A | * | 3/1972 | Wisting ........................ | 55/404 |
| 3,675,165 A | * | 7/1972 | Ueda et al. ................... | 333/252 |
| 3,778,799 A | | 12/1973 | Bendayan | |
| 3,846,798 A | | 11/1974 | Carl | |
| 4,286,240 A | * | 8/1981 | Shively et al. .............. | 333/252 |
| 4,338,102 A | * | 7/1982 | Otsuka et al. ................ | 55/301 |
| 4,500,859 A | * | 2/1985 | Ren et al. .................... | 333/208 |
| 4,556,854 A | | 12/1985 | Hiramatsu | |
| 4,757,292 A | * | 7/1988 | Basil et al. ................. | 333/244 |
| 5,041,804 A | | 8/1991 | Brown | |
| 5,072,202 A | | 12/1991 | Tikes et al. | |
| 5,346,518 A | * | 9/1994 | Baseman et al. ............. | 96/126 |
| 5,469,024 A | * | 11/1995 | Kirshner et al. ........... | 315/5.39 |
| 5,471,182 A | * | 11/1995 | Rivera et al. ............... | 333/252 |
| 5,936,493 A | * | 8/1999 | Hulderman et al. ........ | 333/252 |
| 6,586,716 B1 | * | 7/2003 | Lee ............................ | 219/757 |

OTHER PUBLICATIONS

Jostingmeier, A. et al. "Systematic Design of An S–Band Pillbox–Type RF Window", XIX International Linear Accelerator Conference, pps. 249–251, (1998).

* cited by examiner

Primary Examiner—Robin O. Evans
Assistant Examiner—Leonid M Fastovsky
(74) Attorney, Agent, or Firm—Nutter, McClennen & Fish

(57) ABSTRACT

A waveguide system for passing microwave energy while blocking foreign particles from a moving gas passing through the system is provided. The system includes first and second waveguide sections and a low loss microwave window disposed between the waveguide sections to allow microwave energy to pass from the first waveguide section through the window to the second waveguide section. The system also includes a gas bypass filtration system having a first port in communication with the first waveguide section, a filter element in communication with the first port, and a second port in communication with the filter element and with the second waveguide section. The system of the invention having these features blocks, by means of the window, a gas flowing through the first waveguide section and forces that gas to flow through the gas bypass filtration system so that it enters the second waveguide section only after passing through the filter. A system designed to include a pillbox window is also provided.

18 Claims, 4 Drawing Sheets

WAVEGUIDE FOREIGN OBJECT DAMAGE PREVENTION WINDOW

CROSS REFERENCE TO RELATED APPLICATIONS

This application claims priority to, and incorporates herein by reference, U.S. Provisional Patent Application No. 60/312,857, entitled Wave guide Foreign Object Damage Prevention Window, and filed on Aug. 16, 2001.

FIELD OF THE INVENTION

The present invention relates to a microwave window system designed to block foreign particles such as dust and other gas borne particles from entering a waveguide circuit while allowing pressurized gas and microwave energy to pass through to a microwave network. The system of the invention combines the concept of a very low loss microwave window designed to pass microwave energy with a channel designed to filter the gas and capture particles that could damage sensitive components within the system.

BACKGROUND OF THE INVENTION

The need for differential pressures within microwave devices is well established. For various applications, including high power microwave transmission, the waveguide through which the transmission takes place is routinely pressurized to suppress arcing within the waveguide. In other applications, including the use of microwave transmission to heat moving fluids in industrial and food processing processes, pressurized inert gas may be applied to the heating chamber to prevent combustion of the elements being heated. In still other applications, certain portions of the microwave circuit may operated under a vacuum.

In response to these needs, microwave windows have been developed. These windows are designed to insulate microwave circuits from such differential pressures, but they enable the propagation of microwaves without introducing reflection or internal resonance. For example, U.S. Pat. No. 3,781,726 entitled "Wave guide Window Assembly" discloses a waveguide gas pressure window that in a single assembly provides a waveguide window and a pressure seal to gases, while at the same time providing a low loss transfer of power through the window from a first waveguide section into a second waveguide section. The waveguide window includes a plate having the shape of the waveguide flange with a seal material positioned in a groove on both sides of the plate to contact the two waveguide flanges between which the window is mounted. The flat plate has a common flanged opening formed on one side thereof in which a window structure is positioned on shoulders and firmly bonded in position with a suitable retaining material. The window structure is formed of a suitable dielectric material such as a Teflon fiberglass plate having copper sheets deposited on both sides thereof with the copper etched or removed from the fiberglass to provide a window having the desired impedance matching characteristics.

In a further example, U.S. Pat. No. 3,675,165 entitled "Wave guide Window for Transmission of Electromagnetic Waves" discloses a window for sealing a waveguide gas pressurized to transmit microwave signals. This system includes a dielectric plate permeable to the microwave signals and a mechanical structure hermetically sealing the dielectric plate in the interior of the waveguide and including four openings dimensioned to provide the window with a substantially flat voltage standing wave ratio versus frequency characteristic over a predetermined frequency range. The system further includes two relatively movable members to permit the dielectric plate to move to compensate for unequal gas pressures on opposite surfaces thereof, and a space to allow movement of the two members to compensate for thermal expansion thereof due to microwave signal loss in the dielectric plate.

In a still further example, U.S. Pat. No. 4,556,854 entitled "Microwave Window and Matching Structure" discloses a circular waveguide window between two rectangular waveguides having increased bandwidth and increased power handling capability. It uses particular window and impedance matching structures whose dimensions are related in a particular way to the dimensions of the rectangular waveguides.

While all of these windows form gas tight seals within a microwave circuit, in certain applications, it is desirable to allow gas to flow across such a boundary in order to equalize the pressure on either side of the window, or to bring a pressure differential across a window within predetermined bounds. In these situations, gas flowing within the microwave circuit could contain small particles that facilitate waveguide arcing or damage intricately machined components. One attempt to address this problem can be found in U.S. Pat. No. 5,041,804 entitled "Particle Filter for Wave guides." In this patent, a waveguide is provided which can include a bearing supporting a probe or other equipment for rotation. In order to prevent particles of the waveguide metal or waveguide cleaning materials embedded in the metal from entering the bearing, a window is fitted across the waveguide at a selected position between two waveguide sections or at each of a number of positions, the window being transparent to microwave transmission, being capable of transmitting pressure and being capable of filtering particles of a diameter in excess in 0.005 inch. In forming a porous window for this application, however, constraints on the material and structural aspects of the window that are required for achieving the desired filtering capacity may not result in desirable electromagnetic or physical performance. In addition, trapping particles within the transmission line can cause undesirable arcing, and, should the window of this patent become clogged or damaged, the waveguide system must be disassembled in order for the filter to be cleaned or replaced.

Accordingly, a need exists for a system for controlling the flow of a gas through a microwave circuit. The system would preferably be an integrated system that could be placed in-line with a waveguide structure, result in low loss or disruption to the electromagnetic signal, and permit gas to flow through the system while stopping particulates that might cause mechanical or electrical damage to the microwave system.

SUMMARY OF THE INVENTION

The present invention addresses the needs described above as well as others by combining a low loss microwave window designed to pass microwave energy with a bypass channel designed to filter gas and capture particles that could damage sensitive components within the system. By doing so, the invention provides an integrated microwave window system designed to block foreign particles such as dust and other gas borne particles from entering a waveguide circuit while allowing pressurized gas and microwave energy to pass through to a microwave network.

In a first aspect, the invention provides a waveguide system for passing microwave energy while blocking foreign particles from a moving gas also passing through the system. The system of the invention includes first and second waveguide sections and a low loss microwave window disposed between the waveguide sections to allow microwave energy to pass from the first waveguide section through the window to the second waveguide section. The system of the invention also includes a gas bypass filtration system having a first port in communication with the first waveguide section, a filter element in communication with the first port, and a second port in communication with the filter element and with the second waveguide section. The system of the invention having these features blocks, by means of the window, a gas flowing through the first waveguide section and forces that gas to flow through the gas bypass filtration system so that it enters the second waveguide section only after passing through the filter.

In specific embodiments of the invention, the low loss microwave window and the gas bypass filtration system are provided in a single integrated module, the filter element is disposed outside of any microwave energy passing through the system, and/or the filter element is removably replaceable without disassembly of any microwave components. The first and second ports can be located in regions of low electromagnetic wave energy and the first port can include a number of orifices sized so as to provide a preliminary filtering of particles out of a stream of gas. In addition, the low loss microwave window can be supported within a surrounding window support and can be supported within that support by a mechanically isolating diaphragm.

The gas bypass filtration system can also further include an annular airspace surrounding the window support and communicating with the first port, a first gas pathway providing gaseous communication between the annular airspace and the filter element, and a second gas pathway providing gaseous communication between the filter element and the second port.

In a further aspect of the invention, an integrated pillbox window microwave transmission system and bypass gas filtration system is provided. This system includes a low loss circular microwave window supported within a cylindrical window support and having opposed first and second sides, as well as a gas filtration system. The gas filtration system has a first port in communication with the first side of the window, a filter element in communication with the first port, and a second port in communication with the filter element and with the second side of the window. In this system, microwave energy is transmitted through the window while gas is blocked by the window so that the gas must flow from the first side of the window to the second side of the window only through the gas filtration system.

In specific embodiments of this aspect of the invention also, the low loss microwave window and the gas bypass filtration system are provided in a single integrated module, the filter element is disposed outside of any microwave energy passing through the system, and/or the filter element is removably replaceable without disassembly of any microwave components. The first and second ports can be located in regions of low electromagnetic wave energy and the first port can include a number of orifices sized so as to provide preliminary filtering of particles out of a stream of gas. In addition, the low loss microwave window can be supported within the window support by a mechanically isolating diaphragm. The gas filtration system can also include an annular airspace surrounding the window support and communicating with the first port, a first gas pathway providing gaseous communication between the annular airspace and the filter element, and a second gas pathway providing gaseous communication between the filter element and the second port.

BRIEF DESCRIPTION OF THE DRAWINGS

The invention will be more fully understood from the following detailed description taken in conjunction with the accompanying drawings.

DETAILED DESCRIPTION OF THE INVENTION

The present invention combines the concept of a very low loss microwave window designed to pass microwave energy with a channel designed to filter the gas and capture particles that could damage sensitive components within the system. The invention provides an integrated microwave window system designed to block foreign particles such as dust and other gas borne particles from entering a waveguide circuit while allowing pressurized gas and microwave energy to pass through to a microwave network.

Figure 1:
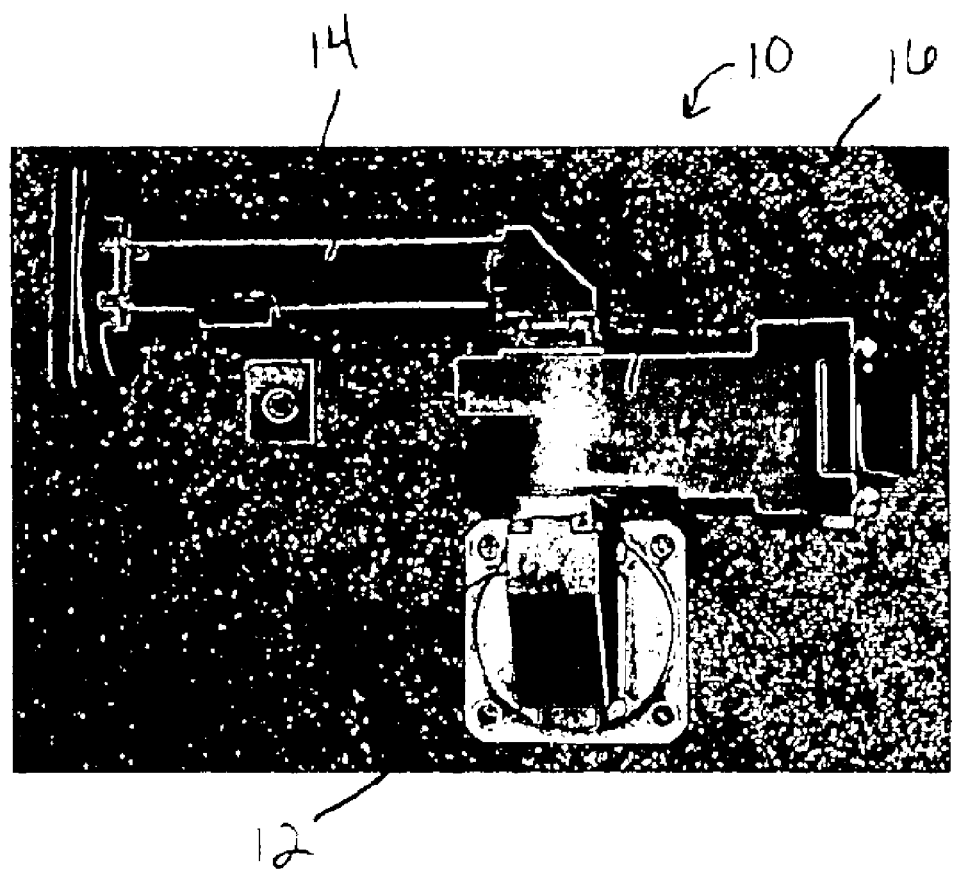
FIG. 1 a perspective view of an in-line waveguide foreign object damage prevention window module of the invention disposed between two waveguides.

FIG. 1 illustrates an exemplary system of the invention 10 having a first waveguide section 12 that communicates with a second waveguide section 14 through a foreign object damage prevention window module 16. Wave guide sections 10, 12 are illustrated as rectangular waveguides, however, they could be made in several types of cross-sectional configurations and can be used, for example, to interconnect components such as an antenna and a receiving unit, or various auxiliary signal conditioning or other components of a radar system including airborne radar systems.

The elements of the exemplary embodiment of FIG. 1 can be explained in greater detail by reference to the cross-sectional and side views of FIGS. 2 and 3, respectively, in addition to FIG. 1. First waveguide section 12 is a rectangular waveguide with a connecting flange 18 and corner section 20. Second waveguide section 14 is also a rectangular waveguide and includes a connecting flange 22 and a corner section 24. A person of ordinary skill in the art will recognize that the configuration of these flanges 18, 22 and corner sections 20, 24 can be varied or even removed depending upon the specific application of the system of the invention.

Foreign object damage prevention window module 16 electromagnetically connects the first and second waveguide sections 12, 14 through a microwave transparent dielectric window 26. The illustrated window 26 is disc-shaped and is supported in a generally cylindrical support 28 commonly referred to as a "pillbox." Thus, in the illustrated embodiment, the microwave waveguide sections are rectangular in cross-section and the dielectric window is circular in cross-section. These components form a gas pressure barrier as well as a guide for electromagnetic energy.

Figure 4:
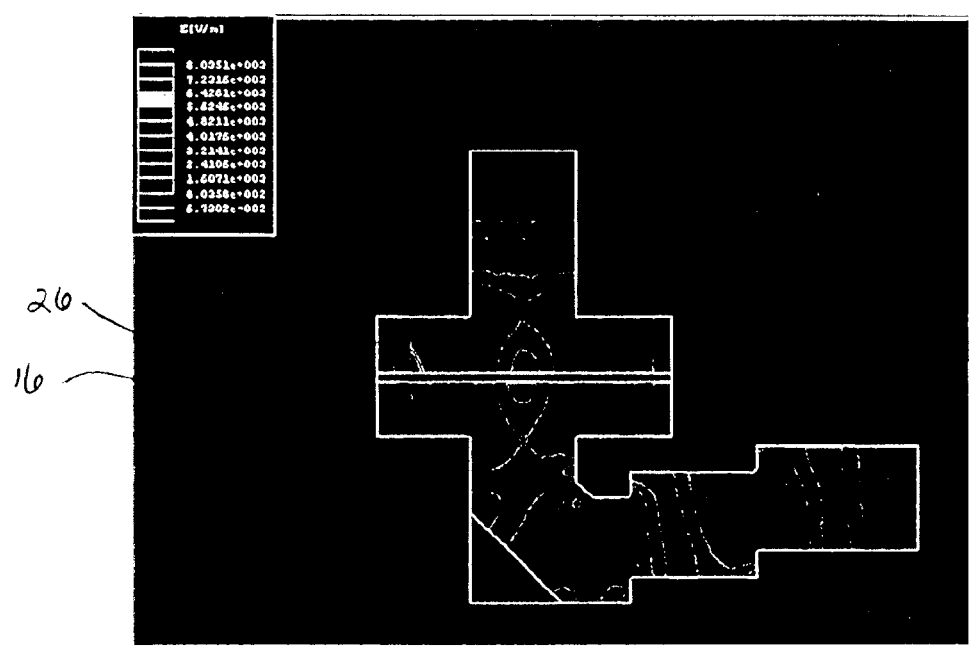
FIG. 4 illustrates a simulation of electric field strength in the system of FIG. 1.

Pillbox window designs for connecting rectangular waveguides are well known in the art, for example, U.S. Pat. No. 5,072,202 entitled "Wide band Power Microwave Window with Improved Mechanical and Electrical Behavior" and A. Jostingmeier et al., "Systematic Design of an S-Band Pillbox-Type RF Window," XIX International Linear Accelerator Conference, Aug. 24, 1998 are both expressly incorporated herein for their various aspects of window design. Further, while a pillbox window is described in the illustrated embodiments, a person of ordinary skill will understand that other window designs could be used, including, for example, placing a rectangular window within a rectangular waveguide as is also well known in the art. Regardless of the window design chosen, window 26 should be properly matched to compensate for impedance changes inherent in the structure being employed in the design. Appropriate design parameters for achieving such matching can be found in the two references above, as well as in the references referenced in the Background of the Invention section of this application, which are hereby incorporated by reference. In addition, the person of ordinary skill in the art may simulate the electromagnetic performance of designs or potential designs using commercially available software created for this purpose such as three dimensional electromagnetic design and visualization software (such as, for example, CST Microwave Studio available from CST of America, Inc. of Wellesley, Mass.). An exemplary simulation showing electric field strength within module 16 of the invention and including window 26 is illustrated in FIG. 4.

Figure 2:
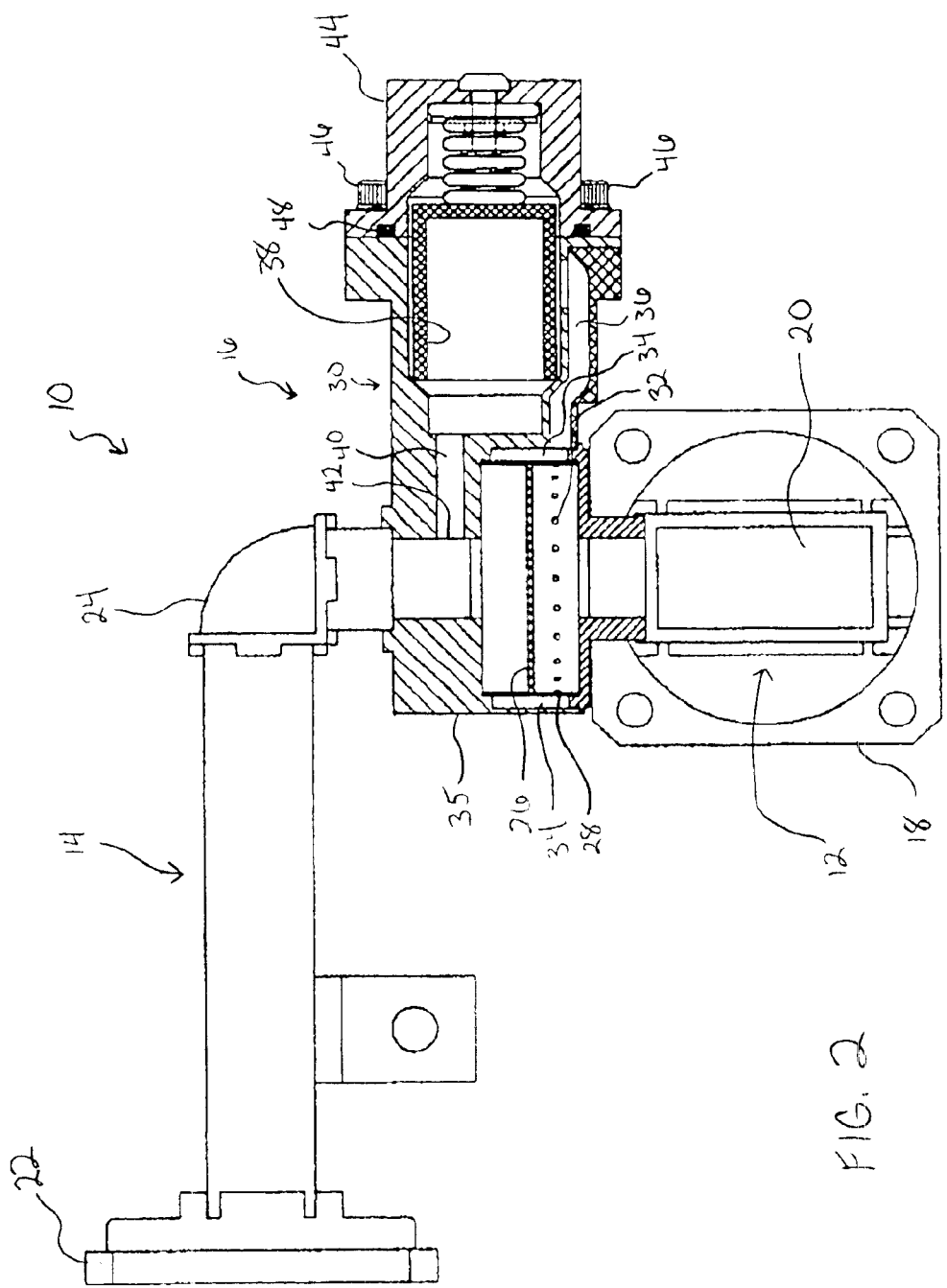
FIG. 2 is a cross-sectional view of the system of FIG. 1.
Figure 3:
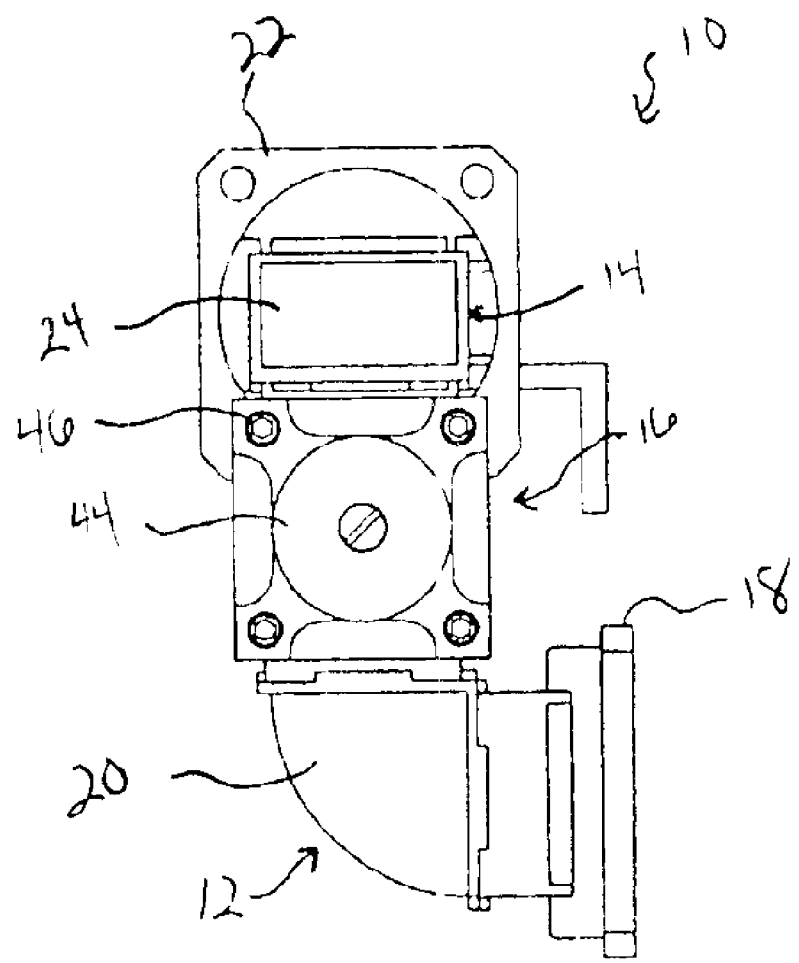
FIG. 3 is a side view of the system of FIG. 1.

The pillbox window structure can be built from machined or cast parts, then brazed, soldered or assembled into a single structure as illustrated in FIG. 2. The pillbox window structure can then be brazed into the larger assembly. With the components brazed into a single sealed structure, the structure will have the ability to hold gas pressure as desired. In addition, the window structure can be designed for use over a broad temperature range by selecting materials having compatible coefficients of thermal expansion. For example, where dielectric window 26 is formed from a ceramic, the window can be supported within cylindrical chamber 28 using a copper diaphragm, mechanically isolating window 26 from the rest of the module 16 assembly so that the ceramic window is not stressed during changes in temperature.

The system of the invention also includes a gas bypass filtration assembly 30 including one or more gas entry ports 32 in communication with first waveguide 12, an airspace 34 defined between the entry ports 32 and a module housing 35, a first gas path 36 providing a gas pathway from airspace 34 to a filter 38, and a second gas path 40 leading to one or more gas exit ports 42 which communicate with second waveguide 14. As illustrated, gas entry ports 32 comprise a plurality of small ports disposed around window support 28 below window 26 in communication with first waveguide section 12. Gas entry ports 32 are preferably placed in areas of low electromagnetic wave energy to prevent electric breakdown and unnecessary losses in an electromagnetic signal passing through the waveguides. In addition, gas entry ports 32 can be sized so as to perform a first pass filtering of the gas traveling through the system by blocking larger particles from passing through the ports. Gas entry ports 32 can also be located around the circumference of window support 28 to reduce the likelihood that the entry ports will become clogged and to allow for the system of the invention 10 to be mounted in a variety of orientations.

In the illustrated pillbox design, airspace 34 can be designed as an annular chamber that, circumscribes support 28 and encompasses a backside of gas entry ports 32. This configuration allows gas flowing through gas entry ports 32 to travel into first gas path 36 and on to filter 38. A person of ordinary skill in the art will recognize that the precise configuration of airspace 34 will depend upon the geometry of the window and gas entry ports selected.

Filter 38 can be a porous solid filter cup that is U-shaped in cross-section as illustrated in FIG. 2 such as a sintered ceramic or metallic filter element. The outside portion of illustrated cup filter 38 communicates with first gas path 36 while the inside portion communicates with second gas path 40. Gas bypass filter assembly 30 also includes a cap 44 to close a chamber about the filter and is secured by screws 46 and sealed by O-ring 48. This configuration allows for easy replacement of filters, including for the purpose of providing a filter having different porosity for providing desired filtration or pressure differential results. In addition, a pressure valve can be included in gas bypass filter assembly 30 if desired to provide a limit for any pressure differential that might occur across window 26.

By placing the gas bypass filter assembly 30, and particularly filter 38, outside of the transmission path of electromagnetic signals traveling through system 10, the effects of arcing during operation that may result from the presence of large accumulations of particulates can be reduced or eliminated.

Use of the invention results in parallel paths through system 10, one path for microwave transmission and a second path for gas filtering. These two paths are provided within a single, integrated module that can be connected between standard waveguides, resulting in lower part counts, smaller packaging, and higher reliability than other designs. In addition, the integrated module of the present invention can be connected to standard waveguides and can be used under static pressure, ambient pressure or in a sealed system without degrading the desired pressure system and without degrading the performance of the desired pressure system.

A person of ordinary skill in the art will appreciate further features and advantages of the invention based on the above-described embodiments including the incorporation of window features known in the art including those described in references cited in the Background of the Invention section of this application. Accordingly, the invention is not to be limited by what has been particularly shown and described, except as indicated by the appended claims. All publications and references cited herein are expressly incorporated herein by reference in their entity.

What is claimed is:

1. A waveguide system for passing microwave energy while blocking foreign particles from a moving gas passing through the system, comprising:
   first and second waveguide sections;
   a low loss microwave window disposed between the first and second waveguide sections to allow microwave energy to pass from the first waveguide section through the window to the second waveguide section; and
   a gas bypass filtration system having
      a first port in communication with the first waveguide section, the first port having a plurality of orifices sized so as to provide preliminary filtering of particals out of a stream of gas;
      a filter element in communication with the first port; and
      a second port in communication with the filter element and with the second waveguide section;
   whereby a gas flowing through the first waveguide section is blocked by the window and flows through the gas bypass filtration system and enters the second waveguide section after passing through the filter.

2. The system of claim 1, wherein the low loss microwave window and the gas bypass filtration system are provided in a single integrated module.

3. The system of claim 1, wherein the filter element is disposed outside of any microwave energy passing through the system.

4. The system of claim 1, wherein the first and second ports are located in regions of low electromagnetic wave energy.

5. The system of claim 1, wherein the filter element is removably replaceable without disassembly of any microwave components.

6. The system of claim 1, wherein the low loss microwave window is supported within a surrounding window support.

7. The system of claim 6, wherein the window is supported within the window support by a mechanically isolating diaphragm.

8. A waveguide system for passing microwave energy while blocking foreign particles from a moving gas passing through the system, comprising:
   first and second waveguide sections;
   a low loss microwave window disposed between the first and second waveguide sections to allow microwave energy to pass from the first waveguide section through the window to the second waveguide section, the low loss microwave window being supported within a surrounding window support; and
   a gas bypass filtration system having
      a first port in communication with the first waveguide section, wherein the first port includes a plurality of orifices disposed around the circumscribing window support on a first side of the window
      a filter element in communication with the first port; and
      a second port in communication with the filter element and with the second waveguide section;
   whereby a gas flowing through the first waveguide section is blocked by the window and flows through the gas bypass filtration system and enters the second waveguide section after passing through the filter.

9. The system of claim 8, further comprising an annular airspace surrounding the window support and communicating with the first port, a first gas pathway providing gaseous communication between the annular airspace and the filter element, and a second gas pathway providing gaseous communication between the filter element and the second port.

10. The system of claim 9, wherein the window is circular and the window support is cylindrical.

11. The system of claim 10, wherein the first and second waveguide sections have rectangular cross-sections.

12. An integrated pillbox window microwave transmission system and bypass gas filtration system comprising: first and second rectangular waveguide sections; and
   an integrated pillbox window and bypass gas filtration system provided between the first and second rectangular waveguide sections and including:
      a low loss circular microwave window supported within a cylindrical window support and having opposed first and second sides; and
      a gas filtration system having
         a first port in communication with the first side of the window;
         a filter element in communication with the first port; and
         a second port in communication with the filter element and with the second side of the window;
      whereby microwave energy is transmitted through the window while gas is blocked by the window so as to flow from the first side of the window to the second side of the window only through the gas filtration system; and
   wherein the low loss microwave window and the gas bypass filtration system are provided in a single integrated module.

13. The system of claim 12, wherein the filter element is disposed outside of any microwave energy being transmitted through the system.

14. The system of claim 12, wherein the first and second ports are located in regions of low electromagnetic wave energy.

15. The system of claim 12, wherein the filter element is removably replaceable without disassembly of any microwave components.

16. The system of claim 12, wherein the window is supported within the window support by a mechanically isolating diaphragm.

17. The system of claim 12, wherein the first port includes a plurality of orifices sized so as to provide preliminary filtering of particles out of a stream of gas.

18. The system of claim 17, further comprising an annular airspace surrounding the window support and communicating with the first port, a first gas pathway providing gaseous communication between the annular airspace and the filter element, and a second gas pathway providing gaseous communication between the filter element and the second port.

* * * * *

UNITED STATES PATENT AND TRADEMARK OFFICE
CERTIFICATE OF CORRECTION

PATENT NO. : 6,867,401 B2
DATED : March 15, 2005
INVENTOR(S) : William Conway et al.

It is certified that error appears in the above-identified patent and that said Letters Patent is hereby corrected as shown below:

Title page,
Item [75], Inventors, delete "Robert McGowan" and insert therefor
-- Robert McCowan --.

Signed and Sealed this

Thirty-first Day of May, 2005

JON W. DUDAS
*Director of the United States Patent and Trademark Office*